(12) United States Patent
Huang et al.

(10) Patent No.: US 9,135,103 B2
(45) Date of Patent: Sep. 15, 2015

(54) HYBRID MEMORY FAILURE BITMAP CLASSIFICATION

(71) Applicant: Mentor Graphics Corporation, Wilsonville, OR (US)

(72) Inventors: Yu Huang, Sudbury, MA (US); Wu-Tung Cheng, Lake Oswego, OR (US); Christopher W. Schuermyer, Happy Valley, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 228 days.

(21) Appl. No.: 13/769,230

(22) Filed: Feb. 15, 2013

(65) Prior Publication Data

US 2013/0219216 A1 Aug. 22, 2013

Related U.S. Application Data

(60) Provisional application No. 61/599,542, filed on Feb. 16, 2012.

(51) Int. Cl.
*G06F 11/00* (2006.01)
*G06F 11/07* (2006.01)
*G06N 3/02* (2006.01)
*G11C 29/56* (2006.01)

(52) U.S. Cl.
CPC .............. *G06F 11/079* (2013.01); *G06N 3/02* (2013.01); *G11C 29/56008* (2013.01)

(58) Field of Classification Search
CPC .................. G06F 17/30867; G06F 11/079
See application file for complete search history.

(56) References Cited

U.S. PATENT DOCUMENTS

| 7,137,085 B1* | 11/2006 | Wang et al. .............. 716/136 |
| 7,155,652 B1* | 12/2006 | Shetty ..................... 714/735 |
| 2004/0083407 A1* | 4/2004 | Song et al. ................ 714/27 |
| 2008/0189582 A1* | 8/2008 | Ho et al. .................. 714/718 |
| 2010/0174670 A1* | 7/2010 | Malik et al. ............... 706/12 |

OTHER PUBLICATIONS

By Prashant Dubey, Akhil Garg and Sravan Kumar Bhaskarani "Built in Defect Prognosis for Embedded Memories", IEEE, 2007.
By Randal Collica, Jill Card, and William Martin "SRAM Bitmap Shape Recognition and Sorting Using Neural Networks", IEEE Transactions on Semiconductor Manufacturing, vol. 8, No. 3, Aug. 1995.
By Y.Baltagi et al. "Embedded Memory Fail Analysis for Production Yield Enhancement", IEEE, 2011.

* cited by examiner

*Primary Examiner* — Christopher McCarthy

(57) ABSTRACT

Aspects of the invention relate to techniques for classifying memory failure bitmaps using both rule-based classification and artificial neural network-based classification methods. The rule-based classification method employs classification rules comprising those for global failure patterns. The artificial neural network-based classification method classifies local failure patterns. One of the artificial neural network models is the Kohonen self-organizing map model. The input vector for a failure pattern may contain four elements: pattern aspect ratio, failing bit ratio, dominant failing column number and dominant failing row number.

18 Claims, 11 Drawing Sheets

| Name | Description |
|---|---|
| FMF | Full memory fail with all bits failing |
| FMF85 | Full memory fail with >85% of bits failing |
| MULTI_ADJACENT_ROW | has >=3 adjacent rows with all bits failing |
| ROW | One entire row with all bits failing |
| ROW30 | One entire row with >30% bits failing |
| MULTI_ADJACENT_COL | has >=3 adjacent columns with all bits failing |
| COLUMN | One entire column with all bits failing |
| COLUMN30 | One entire column with >30% bits failing |

FIG. 6

Each node's weights are initialized randomly.
Initialize the learning rate value and the radius value.
Do {
  a)    For each vector in the set of training data. Do {
      (a.1) Every neuron is examined to calculate the Euclidean distance between one's weights and the input vector. Pick the winner with the smallest Euclidean distance.
      (a.2) Any node found within the radius of the winner is deemed to be inside the winner's neighborhood. Each neighboring node's weights are adjusted to make them more close to the input vector.
    }
  b)    Update the learning rate value and radius value.
} while (the difference between two consecutive iterations > predefine threshold)

FIG. 8

1. Set $C_3=0$, $C_4=0$.
2. For each shape, sort the rows according to the failing bit number of the rows in descending order.
3. For each shape, sort the columns according to the failing bit number of the columns in descending order.
4. For each shape, start from the first row. For each row, start from the first column to check the failing bit. We compute the failing bit number for every row (fr), and failing bit number for every column (fc).
5. If the bit is failing, check fr and fc. If fc > fr, this failing bit's property is dominated by the column, so we set $C_3=C_3+1$, and we remove the failing bits in the same column; else we set $C_4=C_4+1$, remove the failing bits in the same row.
6. Update fr and fc.
7. Repeat Step 5 to step 7, until all failing bits are checked.

FIG. 11

HYBRID MEMORY FAILURE BITMAP CLASSIFICATION

RELATED APPLICATIONS

This application claims priority to U.S. Provisional Patent Application No. 61/599,542, entitled "A Hybrid Flow for Memory Failure Bitmap Classification," filed on Feb. 16, 2012, naming Yu Huang et al. as inventors, which application is incorporated entirely herein by reference.

FIELD OF THE INVENTION

The present invention relates to the field of integrated circuit (IC) testing technology. Various implementations of the invention may be particularly useful for fault analysis and yield improvement.

BACKGROUND OF THE INVENTION

Improving manufacturing yield is critical in the semiconductor industry. Because memory arrays have simple, regular structures, memory diagnostics and failure analysis methodologies are widely used to monitor manufacturing processes and to identify yield-limiting root causes. In a typical yield analysis process, memory failure bitmaps are generated based on memory diagnosis results. From the memory failure bitmaps, groups of failing bits (failure patterns) are extracted and classified according to geometric shapes of the failure patterns. Different groups of failure patterns usually correspond to different defect types and thus reveal the yield problems. This process reduces the need of expensive physical failure analysis. Examples showing the association between failure patterns in a memory failure bitmap and physical defect types can be found in a paper by Baltagi et al., "Embedded memory fail analysis for production yield enhancement," in Advanced Semiconductor Manufacturing Conference (ASMC), 2011, 22nd Annual IEEE/SEMI, pp. 1-5, which is incorporated herein by reference.

The classification of failure patterns in a memory bitmap can be performed based on predefined rules. This approach is often referred to as rule-based classification or dictionary-based classification as a dictionary is usually employed to store the predefined rules. Another approach is based on machine learning such as artificial neural networks. In a neural network-based classification process, a neural network model is first established or trained with a set of training failure patterns. Then, feature vectors for failure patterns of interest are extracted. The feature extraction is mainly a data reduction process. Based on the extracted feature vectors, the neural network model assigns the failure patterns of interest to various nodes of the network (defect types).

The rule-based classification is accurate and fast, but cannot work with unknown failure patterns. While the artificial neural network-based classification can classify unknown failure patterns, it is challenging to achieve desired accuracy without resorting to expensive computing resources. A hybrid approach can improve the classification accuracy and/or the classification speed.

BRIEF SUMMARY OF THE INVENTION

Aspects of the invention relate to techniques for classifying memory failure bitmaps using both rule-based classification and artificial neural network-based classification methods. The rule-based classification method employs classification rules comprising those for global failure patterns. The artificial neural network-based classification method classifies failure patterns in a failure bitmap that cannot be identified based on the rule-based classification method. These failure patterns belong to local failure patterns. With some implementations of the invention, the rule-based classification method classifies global failure patterns while the artificial neural network-based classification method classifies local failure patterns.

One of the artificial neural network models is the Kohonen self-organizing map model. The input vector for a failure pattern (pattern feature vectors) may contain four elements: pattern aspect ratio, failing bit ratio, dominant failing column number and dominant failing row number. The Kohonen self-organizing map model can be established by using a training set of failure patterns.

To classify failure patterns based on the artificial neural network model, failure patterns may be extracted from the memory failure bitmap based on physical proximity of failing bits to one another. A pattern feature vector for each of the extracted failure patterns may then be determined. The node in the artificial neural network with the smallest distance from a failure pattern defines the category for the failure pattern.

BRIEF DESCRIPTION OF THE DRAWINGS

FIG. 6 an example of a dictionary for rule-based classification that may be employed by various embodiments of the invention.

FIG. 8 illustrates an example of a pseudo code for training a Kohonen self-organizing map model.

FIG. 11 illustrates an example of a pseudo code for determining dominant failing column number $C_3$ and dominant failing row number $C_4$ for pattern feature vectors.

DETAILED DESCRIPTION OF THE INVENTION

General Considerations

Various aspects of the present invention relate to techniques for classifying memory failure bitmaps using both rule-based classification and artificial neural network-based classification. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "classify" and "extract" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

Figure 1:
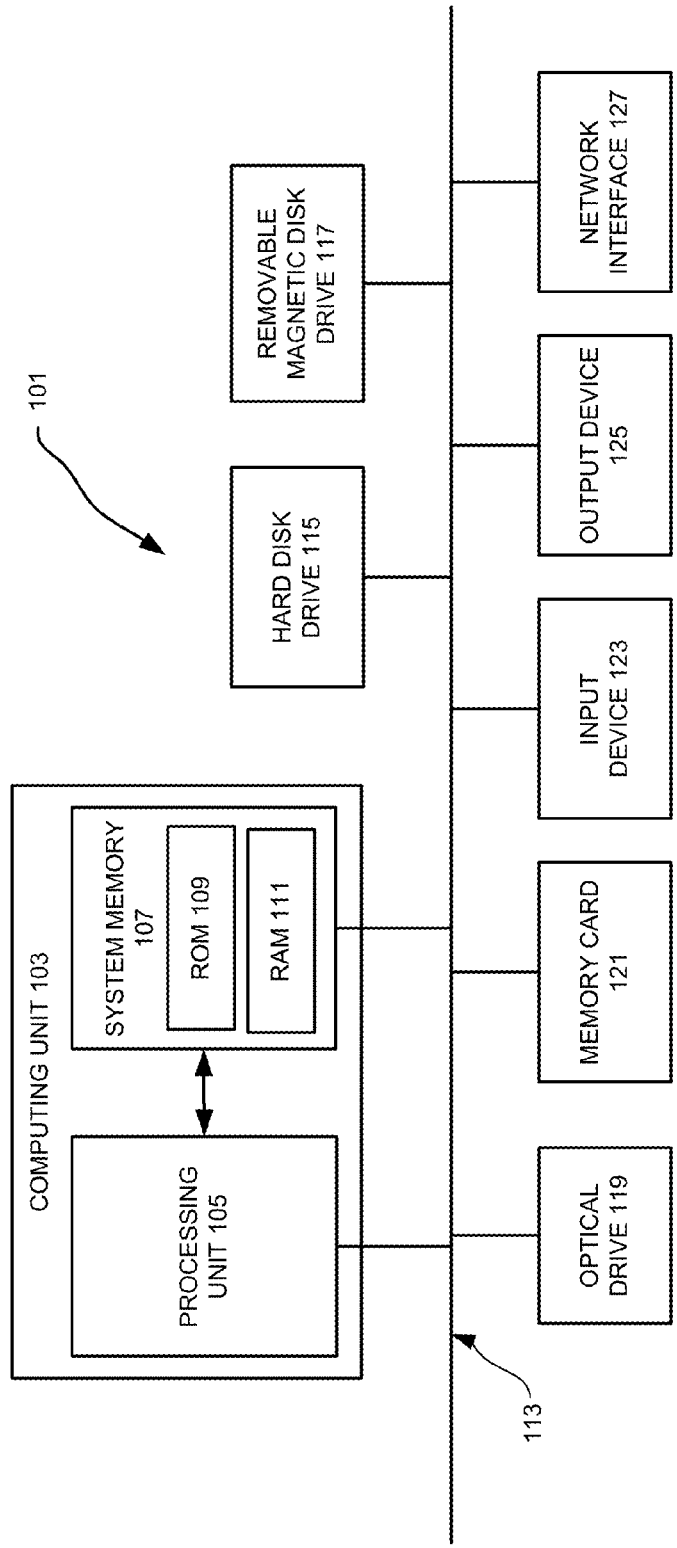
FIG. 1 illustrates a programmable computer system with which various embodiments of the invention may be employed.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Global and Local Failure Patterns

Figure 2:
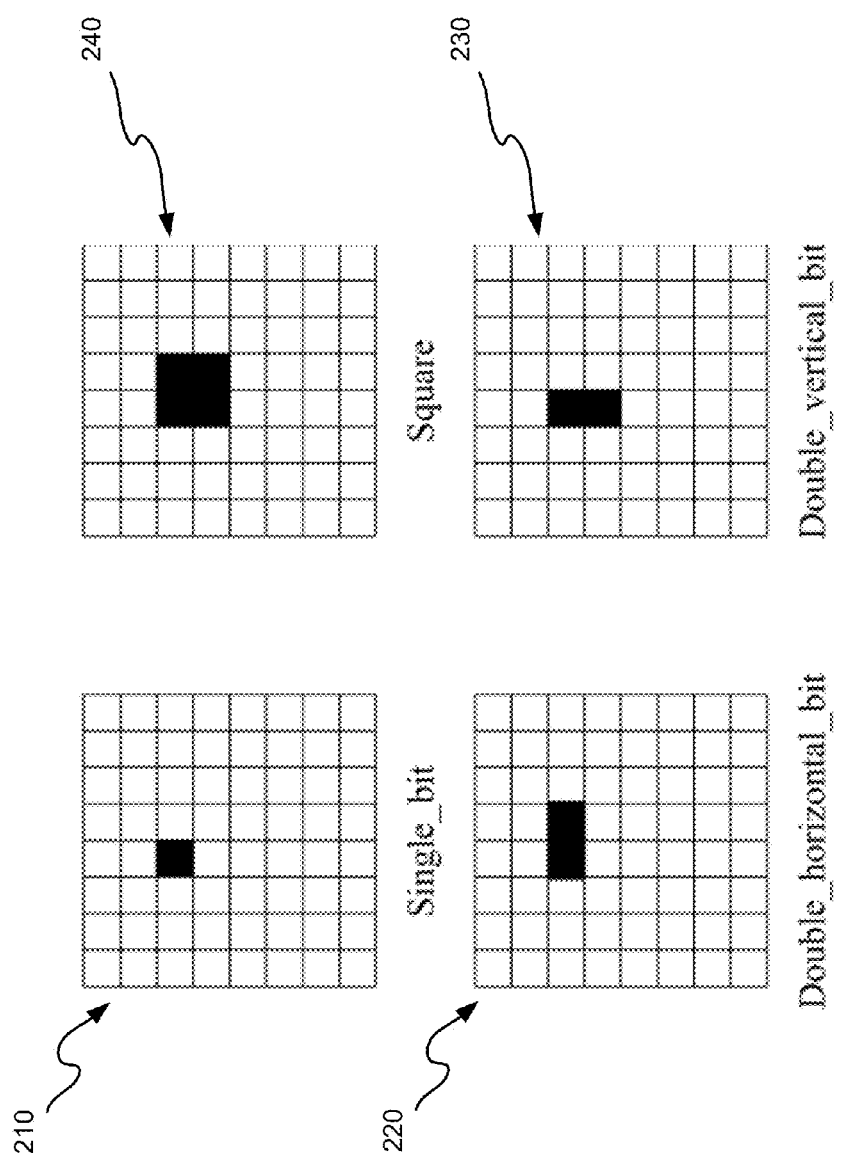
FIG. 2 illustrates four examples of local failure patterns.

With various implementations of the invention, failure patterns in a memory failure bitmap are grouped into two categories, global and local failure patterns. A local failure pattern is formed by one or a few failing bits in a small area. FIG. 2 illustrates several examples of local failure patterns. In the figure, failure pattern 210 is a single-bit pattern, failure pattern 220 is a double-horizontal-bit pattern, failure pattern 230 is a double-vertical-bit pattern, and pattern 240 is a four-bit-square pattern.

Figure 3:
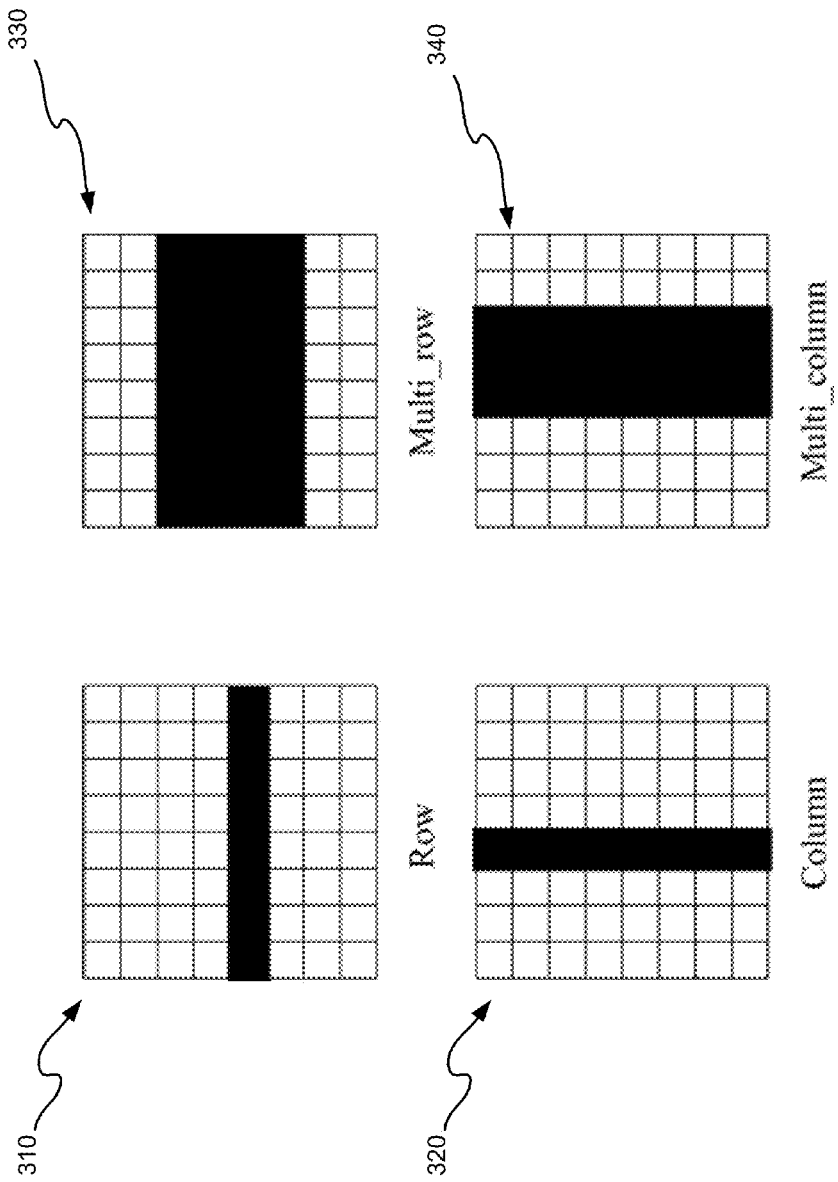
FIG. 3 illustrates four examples of global failure patterns.

A global failure pattern, on the other hand, usually spread across the memory array. FIG. 3 illustrates several examples of global failure patterns. In the figure, failure pattern 310 is a single-row pattern, failure pattern 320 is a single-column pattern, failure pattern 330 is a multi-row pattern, and pattern 340 is a multi-column pattern.

Global failure patterns can be readily enumerated in a dictionary due to the limited number of variations whereas it is impractical to include all possible local failure patterns in a dictionary. On the other hand, a machine learning method such as artificial neural network can classify unknown failure patterns and can be adapted to learn new defect types. Moreover, it may not be efficient to classify global failure patterns with the machine learning method, which will be discussed in detail later. These observations suggest rule-based classification and artificial neural network-based classification may be employed to classify different types of failure patterns in a memory failure bitmap and this hybrid approach can enhance the classification accuracy and/or the classification speed.

Hybrid Bitmap Classification Tools and Methods

Figure 4:
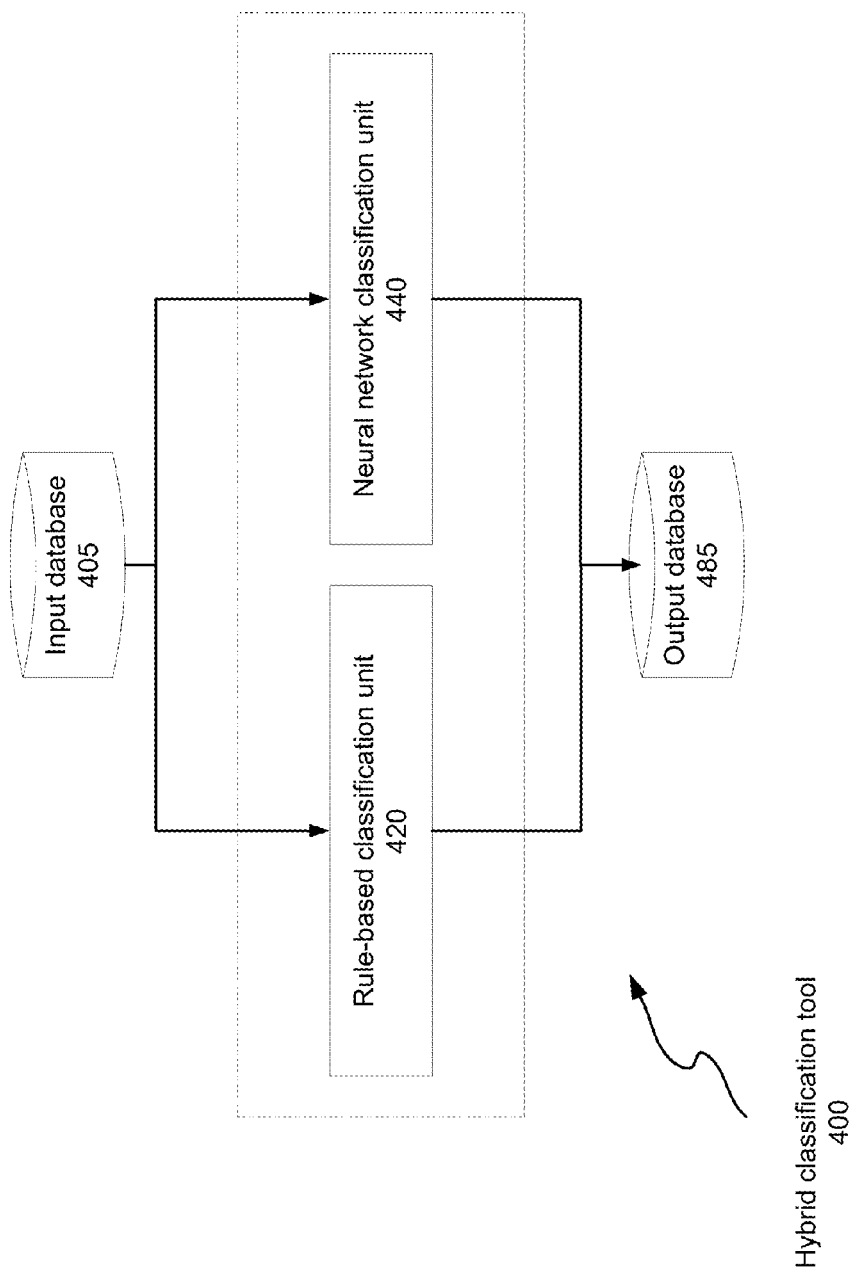
FIG. 4 illustrates an example of a hybrid classification tool according to various embodiments of the invention.

FIG. 4 illustrates an example of a hybrid classification tool according to various embodiments of the invention. As seen in the figure, the hybrid classification tool 400 includes two units: a rule-based classification unit 420 and a neural network classification unit 440. As will be discussed in more detail below, some implementations of the hybrid classification tool 400 may cooperate with (or incorporate) one or more of an input database 405 and an output database 485. While the input database 405 and the output database 485 are shown as separate units in FIG. 4, a single data storage medium may be used to implement some or all of these databases.

According to some embodiments of the invention, either or both of the rule-based classification unit 420 and the neural network classification unit 440 may be implemented by executing programming instructions on one or more programmable computers/computer systems, such as the computing system illustrated in FIG. 1. Correspondingly, some other embodiments of the invention may be implemented by software instructions, stored on a non-transitory computer-readable medium, for instructing one or more programmable computers/computer systems to perform the functions of either or both of the rule-based classification unit 420 and the neural network classification unit 440. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 5:
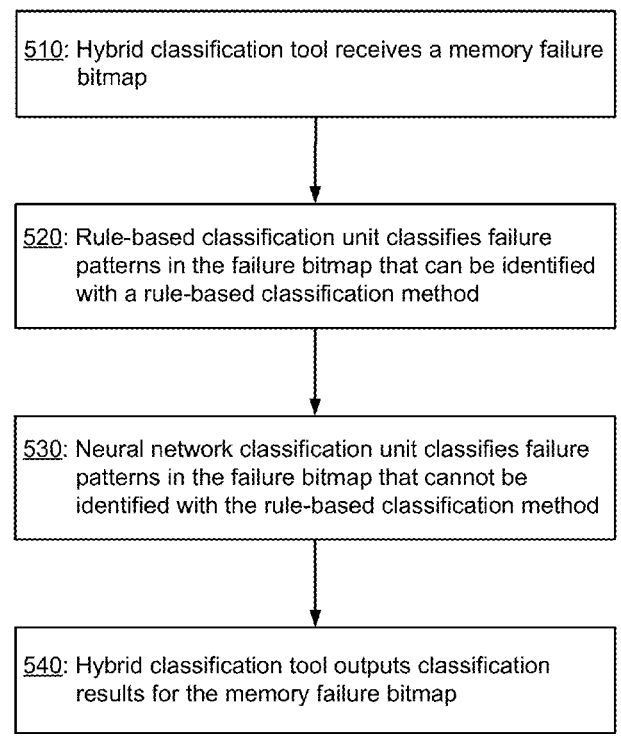
FIG. 5 illustrates a flowchart describing hybrid memory failure bitmap classification methods that may be employed by various embodiments of the invention.

For ease of understanding, hybrid memory failure bitmap classification methods that may be employed according to various embodiments of the invention will be described with reference to the hybrid classification tool 400 illustrated in FIG. 4 and the method for hybrid memory failure bitmap classification in the flow chart 500 in FIG. 5. It should be appreciated, however, that alternate implementations of a hybrid classification tool may be used to perform the method for hybrid memory failure bitmap classification shown in the flow chart 500 according to various embodiments of the invention. In addition, it should be appreciated that implementations of the hybrid classification tool 400 may be employed with other methods for hybrid memory failure bitmap classification according to different embodiments of the invention.

Initially, in operation 510, the hybrid classification tool 400 receives a memory failure bitmap. Next, in operation 520, the rule-based classification unit 420 classifies failure patterns in the failure bitmap that can be identified with a rule-based classification method. As noted previously, global failure patterns can be readily classified by rule-based classification methods. Thus, the rule-based classification method employed by the rule-based classification unit 420 comprises rules for global failure pattern classification. FIG. 6 illustrates an example of a dictionary that may be employed by the rule-based classification unit 420 according to some embodiments of the invention. If existed in the memory failure bitmap, the listed failure patterns can be identified by, for example, scanning the bitmap and counting the number of failing rows/columns and failing bits. With some implementations of the invention, the rule-based classification unit 420 only classifies global failure patterns. With some other implementations of the invention, the rule-based classification unit 420 classifies not only global failure patterns but also one or more local failure patterns.

Figure 7:
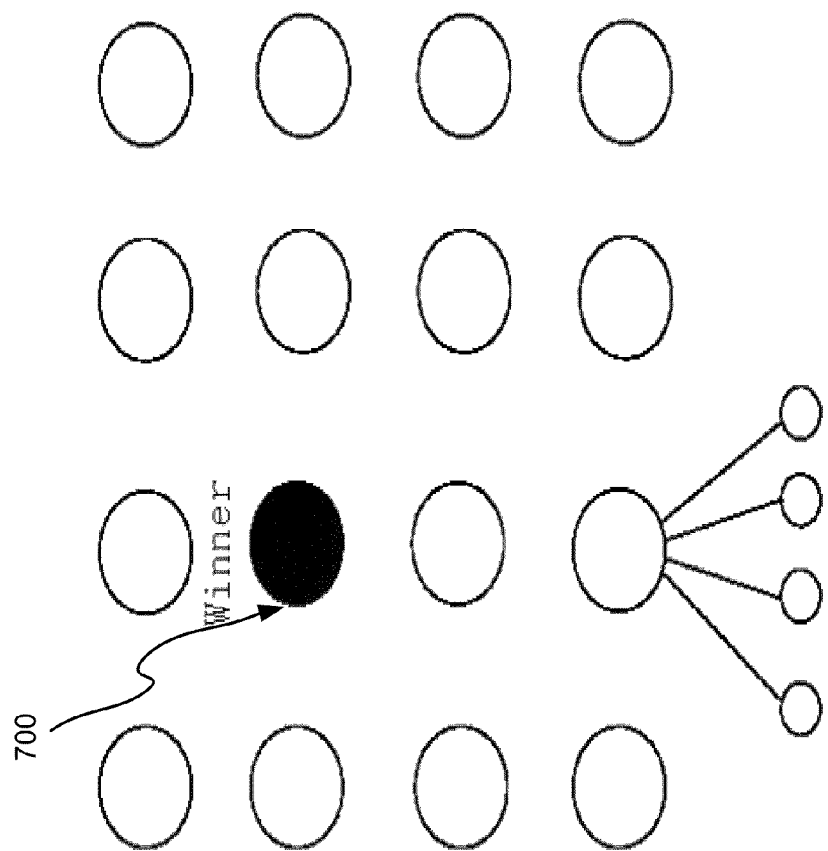
FIG. 7 illustrates an example of the Kohonen self-organizing map.

In operation 530, the neural network classification unit 440 classifies failure patterns in the failure bitmap that cannot be identified with the rule-based classification method. While various artificial neural network models can be employed, the Kohonen self-organizing map model will be used as an example to illustrate the operation in detail. The Kohonen self-organizing map method is an unsupervised artificial neural network method. FIG. 7 shows an example of the Kohonen self-organizing map. In this example, it has sixteen neurons and each neuron has a four-element weight vector. A feature vector (input vector) having the same dimension as the weight vector is used to represent a feature to be classified. For every neuron in the Kohonen self-organizing map, the Euclidean distance between the input vector and the neuron's weight vector is calculated. The neuron with the smallest Euclidean distance is the winner. The winning neuron's output is 1, and others' outputs are 0. In the figure, neuron 700 is assumed to be the winner.

The Kohonen self-organizing map model can be established or trained with a training set. The training process is shown in FIG. 8. In each iteration, after the winner node is determined, the weights (weight vectors) on nodes in the winner's neighborhood are updated. The winner has an influence on all the neurons within its neighborhood. Let W be the weight vector of a neuron, $V_t$ be the input vector. For each dimension k, W is updated by:

$$W_k = W_k + L \times \theta \times (V_k - W_k) \quad (1)$$

where L is called the learning rate, and θ is the influence factor of the winner node. Typically, L is set to a moderate value initially and decreases linearly or exponentially as the number of training iteration increases. The value of θ can be computed by:

$$\theta = \exp\left(-\frac{dist^2}{2r^2}\right) \quad (2)$$

where the dist is the Euclidean distance between the winning node and the neighboring node, r is the winner's influence radius. Typically, r is set to the self-organizing map radius initially and decreases linearly or exponentially as the number of training iteration increase.

Let $W_i$ and $W_j$ be the weight vectors for neuron i and neuron j, respective. If every dimension k of these two vectors meets the condition in Eq. 3, these two neurons can be included in the same class. After the training is finished, the weight vector for each node is determined. The neural network model can be used to classify bitmaps for any input vectors.

$$(W_{ik} - W_{jk}) \le (W_{ik} \times \text{threshold}) \quad (3)$$

Figure 9:
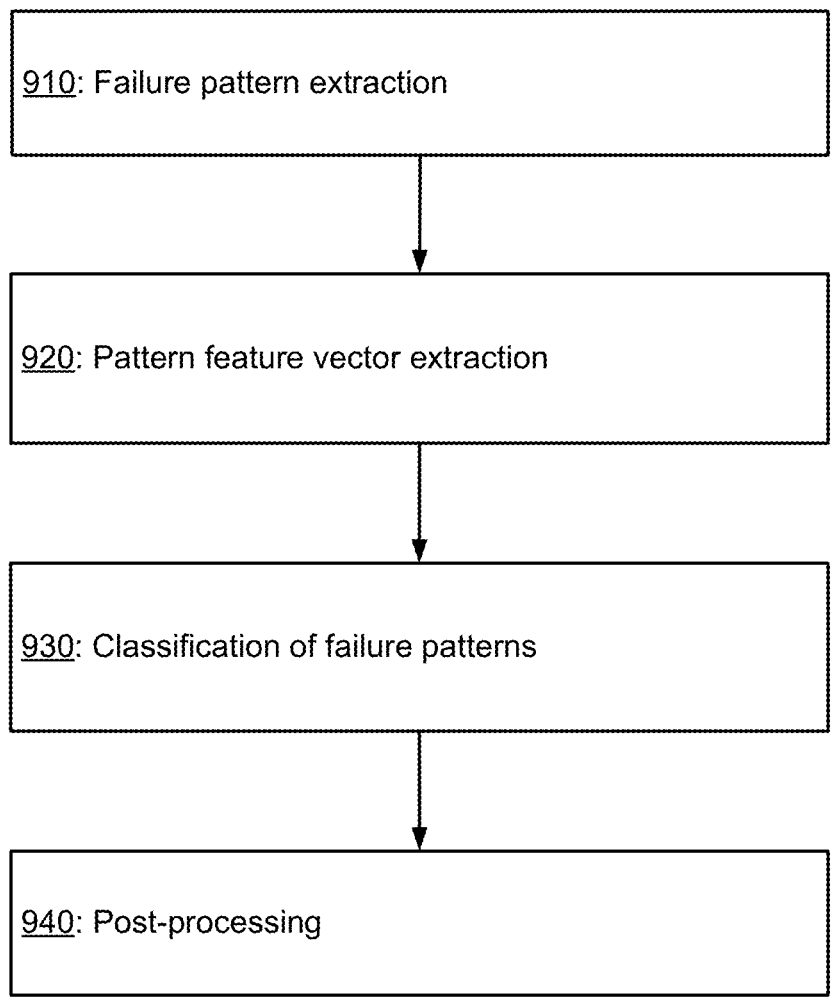
FIG. 9 illustrates a flowchart describing a neural network classification method that may be employed by various embodiments of the invention.

FIG. 9 presents a flow chart describing a neural network classification method the neural network classification unit 440 may employ to perform the operation 530. In operation 910, failure patterns that cannot be identified with the rule-based classification method are extracted. Because the global failure patterns can be identified with the rule-based classification method, the failure patterns for the operation 530 are local failure patterns. A local failure pattern is formed by a clustered set of failing bits in a small area of the memory failure bitmap. One approach the neural network classification unit 440 may use for failure pattern extraction is based on physical proximity of failing bits to one another. A threshold of distance between the failing bits may be set based on trial and error or prior experience. Two failing bits within the threshold distance are considered to be in the same failure pattern.

With some implementations of the invention, the operation 910 is performed prior to the operations 520 and 530. All global and local failure patterns may also be extracted from the memory failure bitmap using the same method.

Figure 10:
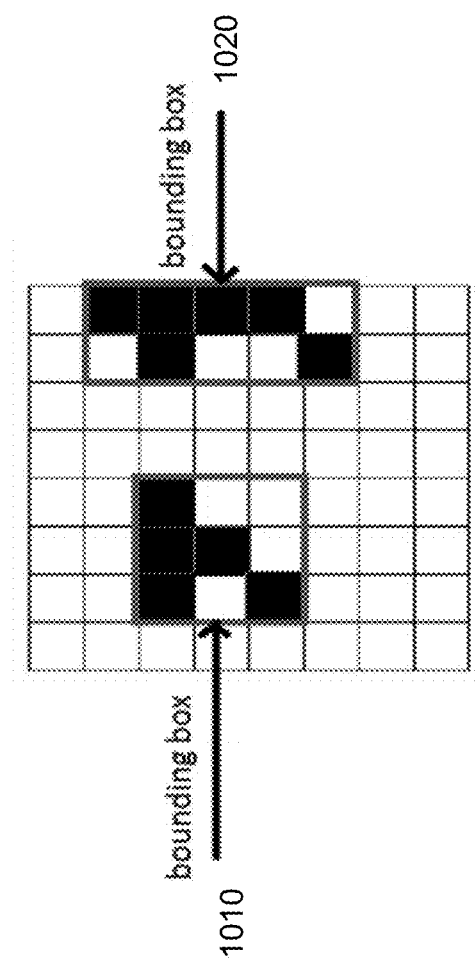
FIG. 10 illustrates bounding boxes for two failure patterns.

After the failure patterns are extracted, in operation 920, the neural network classification unit 440 extracts a pattern feature vector for each of the failure patterns. With some implementations of the invention, the pattern feature vector contains four elements: pattern aspect ratio, failing bit ratio, dominant failing column number and dominant failing row number. To calculate values for the first two elements, a bounding box for each failure pattern may be determined first. A bounding box is the smallest rectangle that contains a failure pattern. FIG. 10 illustrates bounding boxes (1010 and 1020) for two failure patterns. The aspect ratio can be calculated by dividing the number of columns of the bounding box by the number of rows of the bounding box. The failing bit ratio can be calculated by dividing the number of failing bits of the failing pattern by the number of total bits of the bounding box.

One method for determining the dominant failing column number $C_3$ and the dominant failing row number $C_4$ is shown in FIG. 11. After sorting the rows and columns, the row 0 has the most failing bits among the rows, and the column 0 has the most failing bits among the columns. The failure pattern is scanned for failing bits for each row starting from the top row (row 0) to the bottom row, and for each column starting from the left column (column 0) to the right column. Each time, the number of failing bits for a row is compared to the number of failing bits for the corresponding column. Depending on the comparison, either $C_3$ or $C_4$ is incremented, and failing bits in the row or the column are removed.

Next, in operation 930, the neural network classification unit 440 classifies the extracted failure patterns based on an artificial neural network model and the pattern feature vectors. The artificial neural network model may be trained as discussed previously. The Euclidean distance calculated with the pattern feature vector of a failure pattern and the weight vector of each node in the Kohonen self-organizing map is determined and compared to others. The node with the smallest Euclidean distance is the winner.

Next, in operation 940, the neural network classification unit 440 further classifies the failure patterns based on orientation. Some failure patterns with different orientations may not be distinguished by the operation 930. A pattern formed by two adjacent bits from up left to down right and a pattern formed by two adjacent bits from down left to up right are an example. This operation may not be needed if for example, the pattern feature vector with different elements is used.

As will be appreciated by those of ordinary skill in the art, the operation 520 and 530 may be performed concurrently even though the flow chart 500 shows the operation 520 is performed before the operation 530. In some embodiments of the invention, the operation 530 may be performed even before the operation 520.

Lastly, in operation 540, the hybrid classification tool 400 stores classification results from the operations 520 and 530 in one or more computer-readable storage media (e.g., volatile or nonvolatile memory or storage), as shown with the output database 485 in FIG. 4

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. One or more non-transitory computer-readable media storing computer-executable instructions for causing one or more processors to perform a method, the method comprising:
   receiving a memory failure bitmap;
   classifying, based on a rule-based classification method, failure patterns in the memory failure bitmap that can be identified with the rule-based classification method, the rule-based classification method employing rules that comprise rules for global failure pattern classification;
   classifying, based on an artificial neural network method, failure patterns in the memory failure bitmap that cannot be identified based on the rule-based classification method, wherein the failure patterns in the memory failure bitmap that cannot be identified based on the rule-based classification method are local failure patterns; and
   storing classification results for the memory failure bitmap.

2. The one or more non-transitory computer-readable media recited in claim 1, wherein the rule-based classification method classifies only global failure patterns.

3. The one or more non-transitory computer-readable media recited in claim 1, wherein the classifying based on an artificial neural network method comprises:
   extracting failure patterns that cannot be identified based on the rule-based classification method;
   extracting pattern feature vectors for the extracted failure patterns; and
   classifying the extracted failure patterns based on an artificial neural network model and the pattern feature vectors.

4. The one or more non-transitory computer-readable media recited in claim 3, wherein the method further comprises:
   further classifying the rest of the failure patterns based on orientation.

5. The one or more non-transitory computer-readable media recited in claim 3, wherein the pattern feature vectors contain four elements: pattern aspect ratio, failing bit ratio, dominant failing column number and dominant failing row number.

6. The one or more non-transitory computer-readable media recited in claim 1, wherein the artificial neural network method is a Kohonen self-organizing map method.

7. A method, comprising:
   with a computer,
      receiving a memory failure bitmap;
      classifying, based on a rule-based classification method, failure patterns in the memory failure bitmap that can be identified with the rule-based classification method, the rule-based classification method employing rules that comprise rules for global failure pattern classification;
      classifying, based on an artificial neural network method, failure patterns in the memory failure bitmap that cannot be identified based on the rule-based classification method, wherein the failure patterns in the memory failure bitmap that cannot be identified based on the rule-based classification method are local failure patterns; and
      storing classification results for the memory failure bitmap.

8. The method recited in claim 7, wherein the rule-based classification method classifies only global failure patterns.

9. The method recited in claim 7, wherein the classifying based on an artificial neural network method comprises:
   extracting failure patterns that cannot be identified based on the rule-based classification method;
   extracting pattern feature vectors for the extracted failure patterns; and
   classifying the extracted failure patterns based on an artificial neural network model and the pattern feature vectors.

10. The method recited in claim 9, further comprising:
further classifying the rest of the failure patterns based on orientation.

11. The method recited in claim 9, wherein the pattern feature vectors contain four elements: pattern aspect ratio, failing bit ratio, dominant failing column number and dominant failing row number.

12. The method recited in claim 7, wherein the artificial neural network method is a Kohonen self-organizing map method.

13. A system comprising:
one or more processors, the one or more processors programmed to perform a method, the method comprising:
receiving a memory failure bitmap;
classifying, based on a rule-based classification method, failure patterns in the memory failure bitmap that can be identified with the rule-based classification method, the rule-based classification method employing rules that comprise rules for global failure pattern classification;
classifying, based on an artificial neural network method, failure patterns in the memory failure bitmap that cannot be identified based on the rule-based classification method, wherein the failure patterns in the memory failure bitmap that cannot be identified based on the rule-based classification method are local failure patterns; and
storing classification results for the memory failure bitmap.

14. The system recited in claim 13, wherein the rule-based classification method classifies only global failure patterns.

15. The system recited in claim 13, wherein the classifying based on an artificial neural network method comprises:
extracting failure patterns that cannot be identified based on the rule-based classification method;
extracting pattern feature vectors for the extracted failure patterns; and
classifying the extracted failure patterns based on an artificial neural network model and the pattern feature vectors.

16. The system recited in claim 15, wherein the method further comprises:
further classifying the rest of the failure patterns based on orientation.

17. The system recited in claim 15, wherein the pattern feature vectors contain four elements: pattern aspect ratio, failing bit ratio, dominant failing column number and dominant failing row number.

18. The system recited in claim 13, wherein the artificial neural network method is a Kohonen self-organizing map method.

* * * * *